United States Patent
Lin et al.

(10) Patent No.: US 6,865,084 B2
(45) Date of Patent: Mar. 8, 2005

(54) THERMALLY ENHANCED SEMICONDUCTOR PACKAGE WITH EMI SHIELDING

(75) Inventors: Ying-Ren Lin, Taichung (TW); Ho-Yi Tsai, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 90 days.

(21) Appl. No.: 10/434,247

(22) Filed: May 6, 2003

(65) Prior Publication Data

US 2004/0156172 A1 Aug. 12, 2004

(30) Foreign Application Priority Data

Feb. 7, 2003 (TW) .................................. 92102477 A

(51) Int. Cl.$^7$ ................................................ H05K 7/20
(52) U.S. Cl. ................ 361/704; 361/707; 361/709; 361/818; 257/706; 257/712; 257/713; 257/787; 257/796; 174/35 R; 165/80.2; 165/80.3
(58) Field of Search ................ 361/704, 707, 361/709, 818; 257/706, 712, 718, 787, 796; 174/35 R; 165/80.2, 80.3

(56) References Cited

U.S. PATENT DOCUMENTS

| | | | | |
|---|---|---|---|---|
| 5,294,826 A | * | 3/1994 | Marcantonio et al. | 257/659 |
| 5,339,216 A | | 8/1994 | Lin et al. | 361/707 |
| 5,866,943 A | * | 2/1999 | Mertol | 257/712 |
| 5,997,626 A | | 12/1999 | Wu et al. | 106/486 |
| 6,229,702 B1 | * | 5/2001 | Tao et al. | 361/704 |
| 6,313,528 B1 | * | 11/2001 | Solberg | 257/723 |
| 6,472,598 B1 | * | 10/2002 | Glenn | 174/52.2 |
| 6,580,167 B1 | * | 6/2003 | Glenn et al. | 257/718 |
| 6,667,546 B2 | * | 12/2003 | Huang et al. | 257/691 |

* cited by examiner

*Primary Examiner*—Boris Chervinsky
(74) *Attorney, Agent, or Firm*—Peter F. Corless; Steven M. Jensen; Edwards & Angell, LLP

(57) ABSTRACT

A thermally enhanced semiconductor package with EMI (electric and magnetic interference) shielding is provided in which a chip is mounted on and electrically connected to a surface of a substrate, and a thermally conductive member is stacked on the chip and electrically coupled to the surface of the substrate by bonding wires. An encapsulant is formed and encapsulates the chip, thermally conductive member, and bonding wires. A plurality of solder balls are implanted on an opposite surface of the substrate. The thermally conductive member is grounded via the bonding wires, substrate, and solder balls, and provides an EMI shielding effect for the chip to protect the chip against external electric and magnetic interference. The thermally conductive member has a coefficient of thermal expansion similar to that of the chip, and reduces thermal stress exerted on the chip and enhances mechanical strength of the chip to thereby prevent chip cracks.

21 Claims, 2 Drawing Sheets

THERMALLY ENHANCED SEMICONDUCTOR PACKAGE WITH EMI SHIELDING

FIELD OF THE INVENTION

The present invention relates to semiconductor packages, and more particularly, to a thermally enhanced semiconductor package with EMI (electric and magnetic interference) shielding to improve electrical performances of the semiconductor package.

BACKGROUND OF THE INVENTION

A semiconductor package is a structure incorporated with a chip that is made of a semiconductor material such as silicon and encapsulated or packaged with an insulating resin material such as epoxy resin, to allow delicate circuits and electronic elements formed on the chip to be protected by the resin material from external moisture and contaminant. During operation of the chip, heat is produced by consumption or conversion of electric power. However, the chip-encapsulating resin material is relatively poor in thermal conductivity, making heat produced from the chip hard to be dissipated through the resin material to the outside, and heat accumulated in the chip would undesirably damage performances of the chip due to over heat; this overheat problem is more seriously incurred in a highly integrated chip which generates more heat in operation.

Accordingly, U.S. Pat. No. 5,339,216 discloses a semiconductor package with a thermally conductive member, whose structure is illustrated in FIG. 5 in which a chip 22 is mounted on a die pad 21 of a lead frame 20 and electrically connected to leads 24 of the lead frame 20 by a plurality of bonding wires 23. A thermally conductive member 25 is attached to the chip 22 and has a coefficient of thermal expansion (CTE) same as that of the chip 22, so as to allow heat produced from the chip 22 during operation to be dissipated via the thermally conductive member 25 and reduce thermal stress exerted on the chip 22 in subsequent thermal cycling processes. Further, the thermally conductive member 25 provides a support force for the chip 22 and cooperates with the die pad 21 where the chip 22 is mounted and a resin material 26 used for encapsulating the chip 22 to enhance mechanical strength of the chip 22 and prevent the chip 22 from being damaged by external impact such as shock or vibration.

The above semiconductor package may improve heat dissipating efficiency and mechanical strength of the chip; however, it fails to provide a shielding effect for the chip, making the chip easily subject to external electric and magnetic interference (EMI) which adversely affects electrical performances of the chip.

U.S. Pat. No. 5,997,626 proposes a semiconductor package using a heat spreader for providing an EMI shielding effect. As shown in FIG. 6, a heat spreader 33 is prepared by a material with low thermal resistance (such as metal, alloy, etc.) and attached to a substrate 30 that is mounted with a chip 31 and bonding wires 32. This heat spreader 33 is composed of a flat portion 330 and a plurality of support portions 331 protruding from the flat portion 330, allowing the support portions 331 to be connected to a ground ring 34 formed on the substrate 30 to elevate the flat portion 330 above the chip 31 without interfering the bonding wires 32. The flat portion 330 of the heat spreader 33 is further formed with a protruding portion 332 on a side thereof, the protruding portion 332 extending toward the chip 31 to abut against the chip 31, and an opposite side of the flat portion 330 is exposed to outside of a resin material 35 used for encapsulating the chip 31, such that heat produced from the chip 31 can be directly dissipated through the protruding portion 332 and the exposed flat portion 330 of the heat spreader 33 to the atmosphere, thereby improving heat dissipating performances of the semiconductor package. Moreover, the ground ring 34 and the heat spreader 33 form an EMI shielding structure to shield the chip 31 against external electric and magnetic interference.

However, in order to allow the heat spreader to be simultaneously in contact with the ground ring on the substrate and the chip and to allow a side of the heat spreader to be exposed outside, a particularly designed and complexly shaped heat spreader needs to be prepared for the above semiconductor package, which not only increases fabrication costs but also makes fabrication processes more complicated to implement. Further, it is not easy to accurately control progress of the processes for making the complexly structured heat spreader, which may thus degrade dimensional preciseness or yield of the fabricated products; for example, if thickness or heights of the protruding portion and support portions of the heat spreader are formed with dimensional errors, the heat spreader can not properly come into contact with the chip and the ground ring of the substrate simultaneously, and thus heat dissipating and EMI shielding performances would be adversely affected for the semiconductor package.

Therefore, the problem to be solved is to provide a semiconductor package which can assure electrical performances of the chip, simplify fabrication processes, and reduce fabrication costs thereof.

SUMMARY OF THE INVENTION

An objective of the present invention is to provide a thermally enhanced semiconductor package with EMI shielding, allowing a thermally conductive member incorporated therein to be electrically coupled to a substrate by bonding wires and thus to be grounded, so as to provide a shielding effect for a chip in contact with the thermally conductive member and prevent the chip from being affected by external electric and magnetic interference.

Another objective of the invention is to provide a thermally enhanced semiconductor package with EMI shielding, which utilizes a thermally conductive member having a coefficient of thermal expansion (CTE) similar to that of a chip, to thereby reduce thermal stress exerted on the chip and enhance mechanical strength of the chip to prevent chip cracks.

A further objective of the invention is to provide a thermally enhanced semiconductor package with EMI shielding, wherein a thermally conductive member is made of a metal material having thermal conductivity to facilitate dissipation of heat produced from a chip and thereby improve heat dissipating efficiency of the semiconductor package.

A further objective of the invention is to provide a thermally enhanced semiconductor package with EMI shielding, which employs a thermally conductive member of a simple structure to simplify fabrication processes and reduce fabrication costs thereof.

In accordance with the foregoing and other objectives, the present invention proposes a thermally enhanced semiconductor package with EMI shielding, including a substrate having an upper surface and a lower surface opposed to the upper surface; at least one chip mounted on the upper surface of the substrate and electrically connected to the substrate by a plurality of conductive elements, wherein the conductive elements are bonding wires or solder bumps; a thermally conductive member attached to the chip and electrically coupled to the substrate by a plurality of bonding wires; an encapsulant formed on the upper surface of the substrate for encapsulating the chip, conductive elements, thermally conductive member, and bonding wires connected with the thermally conductive member; and a plurality of solder balls implanted on the lower surface of the substrate.

The above semiconductor package yields significant benefits. The thermally conductive member is electrically coupled to the ground ring of the substrate and thus can be grounded via the substrate and solder balls, so as to provide a shielding effect for the chip and prevent the chip from being affected by external electric and magnetic interference, thereby assuring electrical performances of the chip. The thermally conductive member has a similar coefficient of thermal expansion (CTE) to that of the chip, which can reduce thermal stress induced by CTE mismatch and exerted on the chip and also prevent warpage and cracks of the chip from occurrence, such that structural integrity and yield of the fabricated semiconductor package can be assured. Moreover, the thermally conductive member is directly in contact with the chip, allowing heat produced from the chip to be effectively dissipated to the atmosphere via the thermally conductive member; as a result, the chip would not be damaged by heat accumulation or overheat, and heat dissipating efficiency of the semiconductor package can be improved. Furthermore, the thermally conductive member is simple in structure and only needs to be made in contact with the chip, thereby not increasing fabrication costs of the semiconductor package nor making fabrication processes complex to implement.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a thermally enhanced semiconductor package with EMI shielding proposed by the present invention are described in detail as follows with reference to FIGS. 1, 2A–2C, 3 and 4.

First Preferred Embodiment

Figure 1:
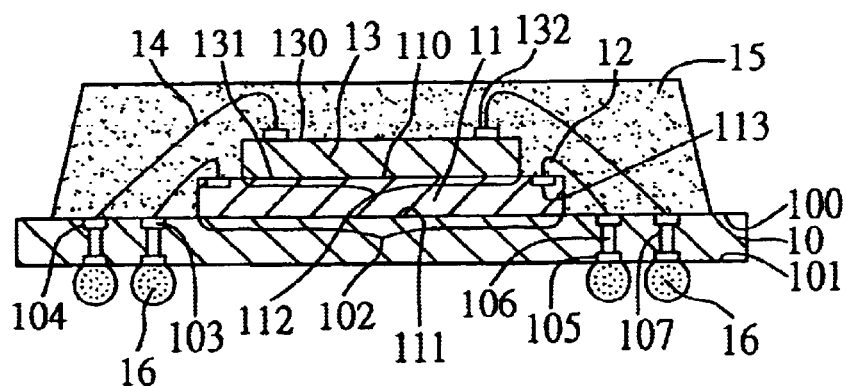
FIG. 1 is a cross-sectional view of a semiconductor package according to a first preferred embodiment of the invention.

FIG. 1 illustrates a semiconductor package according to a first preferred embodiment of the invention. As shown in the drawing, this semiconductor package utilizes a substrate 10 as a chip carrier; the substrate 10 is primarily made of a conventional resin material such as epoxy resin, polyimide resin, BT (bismaleimide triazine) resin, FR4 resin, etc.

The substrate 10 has an upper surface 100 and a lower surface 101 opposed to the upper surface 100, wherein the upper surface 100 is defined with a chip attach area 102, a plurality of bond fingers 103 and a ground ring 104 surrounding the bond fingers 103 are formed outside the chip attach area 102, and a plurality of ball pads 105 are disposed on the lower surface 101 of the substrate 100. The substrate 10 is further formed with a plurality of conductive vias 106 and ground vias 107 penetrating therethrough, wherein the conductive vias 106 have one end thereof connected to the bond fingers 103 and the other end connected to the corresponding ball pads 105, and the ground vias 107 have one end thereof connected to the ground ring 104 and the other end connected to the corresponding ball pads 105. Fabrication processes for the substrate 10 are conventional and not to be further described herein.

At least one chip 11 is prepared having an active surface 110 formed with electronic elements and circuits (not shown) and a non-active surface 111 opposed to the active surface 110. The non-active surface 111 of the chip 11 is attached to the chip attach area 102 on the upper surface 100 of the substrate 10 via an adhesive such as silver paste (not shown). The active surface 110 of the chip 11 is defined with a EMI shielder attach area 112 and formed with a plurality of bond pads 113 outside the EMI shielder attach area 112. A plurality of first bonding wires 12 are bonded to the bond pads 113 of the chip 11 and to the bond fingers 103 on the substrate 10 so as to electrically connect the active surface 110 of the chip 11 to the upper surface 100 of the substrate 10.

A thermally conductive member 13 is prepared having a first surface 130 and a second surface 131 opposed to the first surface 130, allowing the second surface 131 of the thermally conductive member 13 to be adhered to the EMI shielder attach area 112 on the active surface 110 of the chip 11 via an adhesive preferably a thermally conductive and electrically insulating adhesive (not shown). The thermally conductive member 13 has a coefficient of thermal expansion (CTE) similar to that of the chip 11, and can be made of a thermally conductive metal material such as copper.

A metal layer 132 is applied by for example, a conventional electroplating technique, over predetermined portions on the first surface 130 of the thermally conductive member 13. A plurality of second bonding wires 14 are bonded to the metal layer 132 on the thermally conductive member 13 and to the ground ring 104 on the substrate 10 so as to electrically couple the thermally conductive member 13 to the upper surface 100 of the substrate 10. The metal layer 132 is preferably made of a metal material having good bondability with bonding wires, such as nickel/gold (Ni/Au) alloy, silver (Ag), etc., to thereby make the second bonding wires 14 well bonded to the thermally conductive member 13.

Figure 2A:
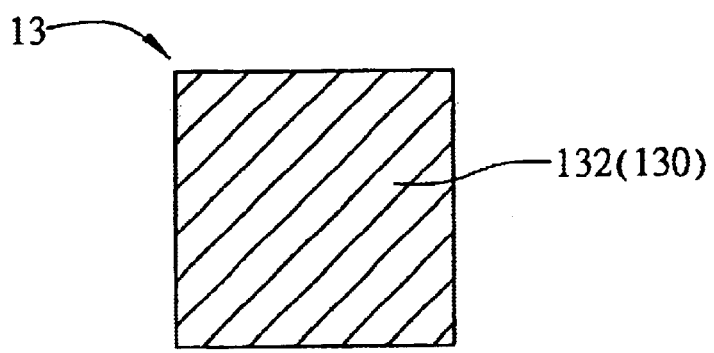
FIGS. 2A–2C are top views of a thermally conductive member used in the semiconductor package according to the invention.
Figure 2B:
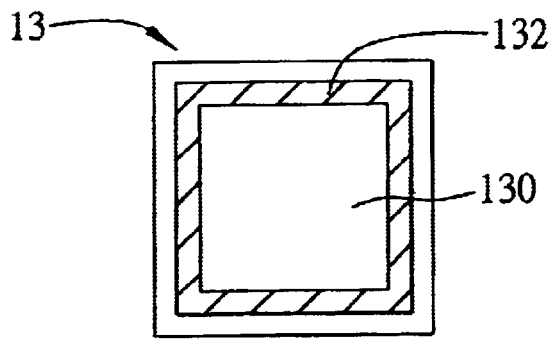
Figure 2C:
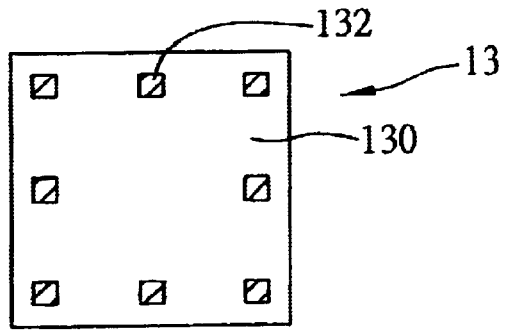

The metal layer 132 can entirely or partly cover the first surface 130 of the thermally conductive member 13. As shown in FIG. 2A, the metal layer 132 covers the entire first surface 130 of the thermally conductive member 13; as shown in FIG. 2B, the metal layer 132 is formed over a ring portion on the first surface 130 of the thermally conductive member 13 and is thus of a ring shape; alternatively, as shown in FIG. 2C, the metal layer 132 is applied over peripheral portions on the first surface 130 of the thermally conductive member 13 to form a plurality of contact points connected with the second bonding wires 14 (shown in FIG. 1). It should be understood that arrangement of the metal layer 132 is not limited to those illustrated by the drawings herein.

Further referring to FIG. 1, a conventional resin material such as epoxy resin is used to form an encapsulant 15 on the upper surface 100 of the substrate 10 and hermetically encapsulate the chip 11, first bonding wires 12, thermally conductive member 13, and second bonding wires 14; these components are thus protected against external moisture and contaminant by the encapsulant 15.

Finally, a plurality of solder balls 16 are implanted at the ball pads 105 on the lower surface 101 of the substrate 10 and serve as I/O (input/output) connections to be electrically connected to an external device such as printed circuit board (PCB, not shown), making the chip 11 electrically coupled to the PCB via the first bonding wires 12, bond fingers 103, conductive vias 106, ball pads 105, and solder balls 16 to be able to operate. Moreover, the thermally conductive member 13 can be grounded in order via the second bonding wires 14, ground ring 104, ground vias 107, solder balls 16, and PCB.

Second Preferred Embodiment

Figure 3:
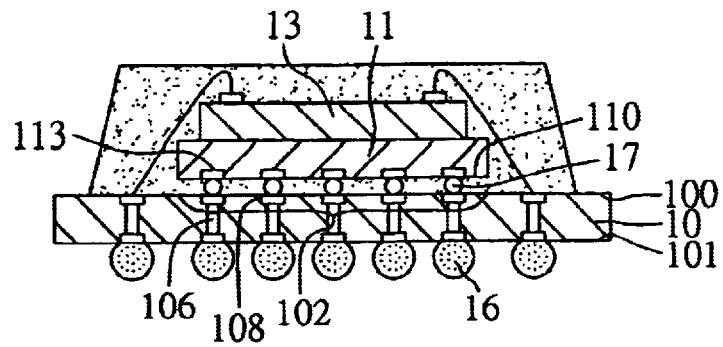
FIG. 3 is a cross-sectional view of a semiconductor package according to a second preferred embodiment of the invention.

FIG. 3 illustrates a semiconductor package according to a second preferred embodiment of the invention. This semiconductor package differs from that of the first embodiment in the way of electrical connection between the chip and substrate. As shown in FIG. 3, the active surface 110 of the chip 11 is mounted in a face-down manner on the chip attach area 102 and electrically connected to the upper surface 100 of the substrate 10 by a plurality of solder bumps 17, wherein the solder bumps 17 have one end thereof connected to a plurality of bond pads 108 formed on the chip attach area 102 and the other end connected to the bond pads 113 formed on the active surface 110 of the chip 11. Further, the conductive vias 106 formed through the substrate 10 have one end thereof connected to the bond pads 108 of the substrate 10 and the other end connected to the solder balls 16 implanted on the lower surface 101 of the substrate 10. This face-down arrangement of the chip electrically coupled to the substrate by solder bumps is customarily referred to as a flip-chip structure, which can effectively shorten an electrical-connection distance between the chip and substrate and thus assure electrical performances and quality of the semiconductor package.

With the active surface 110 of the chip 11 facing downwardly toward the substrate 10, the thermally conductive, member 13 is stacked on the upward non-active surface 111 of the chip 11 free of forming conductive elements such as bonding wires. Thereby, the thermally conductive member 13 is not particularly limited to be sized smaller in surface area than the chip 11, but can be flexibly and optionally dimensioned to be larger (not shown) than, equal (not shown) to, or smaller (shown in FIG. 3) than the chip 11. Similar to the foregoing first embodiment, the thermally conductive member 13 is made of a thermally conductive metal material such as copper, and thus heat produced from the chip 11 can be more effectively dissipated to significantly improve heat dissipating efficiency of the semiconductor package through the use of a relatively larger thermally conductive member 13.

Third Preferred Embodiment

Figure 4:
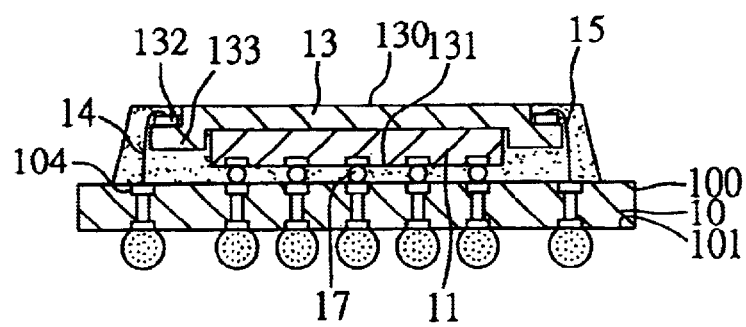
FIG. 4 is a cross-sectional view of a semiconductor package according to a third preferred embodiment of the invention.
Figure 5:
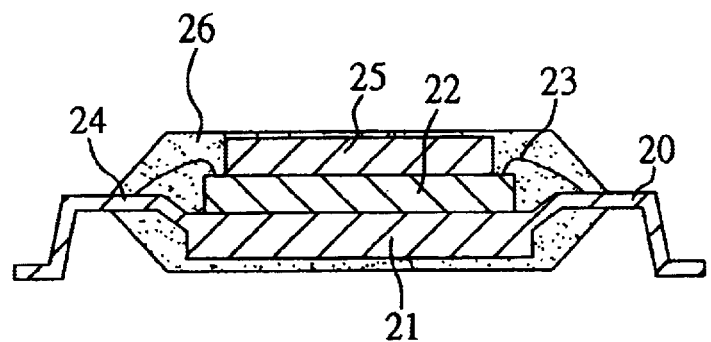
FIG. 5 (PRIOR ART) is a cross-sectional view of a conventional semiconductor package disclosed by U.S. Pat. No. 5,339,216.
Figure 6:
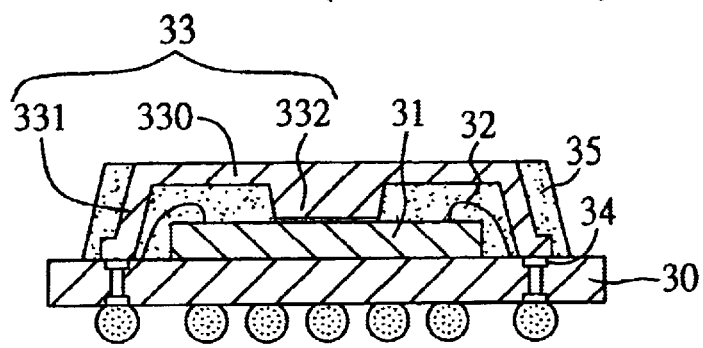
FIG. 6 (PRIOR ART) is a cross-sectional view of a conventional semiconductor package disclosed by U.S. Pat. No. 5,977,626.

FIG. 4 illustrates a semiconductor package according to a third preferred embodiment of the invention. This semiconductor package differs from that of the above second embodiment in that a surface of the thermally conductive member is exposed to outside of the chip-encapsulating encapsulant. As shown in FIG. 4, by the flip-chip arrangement of the chip 11 electrically connected to the substrate 10 via the solder bumps 17, a thermally conductive member 13 larger in surface area than the chip 11 can be used, wherein a recessed portion 133 of a step-like shape (not limited to this) is formed at peripheral area on the first surface 130 of the thermally conductive member 13, and the metal layer 132 is applied over the recessed portion 133 to be connected with bonding wires 14. The recessed portion 133 has a depth greater than a loop height of the bonding wires 14 protruding from the metal layer 132 to allow loops of the bonding wires 14 to be comfortably received with the recessed portion 133. As a result, area on the first surface 130 of the thermally conductive member 13 free of forming the recessed portion 133 can be exposed to outside of the encapsulant 15 that encapsulates the chip 11; this can more efficiently dissipate heat produced from the chip 11 to the atmosphere via the exposed first surface 130 of the thermally conductive member 13 to significantly improve heat dissipating performances of the semiconductor package.

In the foregoing semiconductor packages, the thermally conductive member is electrically coupled to the ground ring of the substrate and thus can be grounded via the substrate and solder balls, so as to provide a shielding effect for the chip and prevent the chip from being affected by external electric and magnetic interference, thereby assuring electrical performances of the chip. The thermally conductive member has a similar coefficient of thermal expansion (CTE) to that of the chip, which can reduce thermal stress induced by CTE mismatch and exerted on the chip and also prevent warpage and cracks of the chip from occurrence, such that structural integrity and yield of the fabricated semiconductor package can be assured. Moreover, the thermally conductive member is directly in contact with the chip, allowing heat produced from the chip to be effectively dissipated to the atmosphere via the thermally conductive member; as a result, the chip would not be damaged by heat accumulation or overheat, and heat dissipating efficiency of the semiconductor package can be improved. Furthermore, the thermally conductive member is simple in structure and only needs to be made in contact with the chip, thereby not increasing fabrication costs of the semiconductor package nor making fabrication processes complex to implement.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A thermally enhanced semiconductor package with EMI shielding, comprising:
    a substrate having an upper surface and a lower surface opposed to the upper surface;
    at least one chip mounted on the upper surface of the substrate and electrically connected to the substrate by a plurality of first bonding wires;
    a thermally conductive member attached to the chip and electrically coupled to the substrate by a plurality of second bonding wires; and an encapsulant formed on the upper surface of the substrate for encapsulating the chip, first bonding wires, thermally conductive member, and second bonding wires.

2. The thermally enhanced semiconductor package of claim 1, further comprising: a plurality of solder balls implanted on the lower surface of the substrate.

3. The thermally enhanced semiconductor package of claim 1, wherein the thermally conductive member has a coefficient of thermal expansion similar to that of the chip.

4. The thermally enhanced semiconductor package of claim 3, wherein the thermally conductive member is made of copper.

5. The thermally enhanced semiconductor package of claim 1, wherein the thermally conductive member has a first surface and a second surface opposed to the first surface, allowing the second surface to be in contact with the chip, and a metal layer is applied over predetermined portions on the first surface of the thermally conductive member and connected with the second bonding wires.

6. The thermally enhanced semiconductor package of claim 5, wherein the metal layer entirely or partly covers the first surface of the thermally conductive member.

7. The thermally enhanced semiconductor package of claim 5, wherein the metal layer is made of nickel/gold (Ni/Au) alloy or silver (Ag).

8. The thermally enhanced semiconductor package of claim 1, wherein the chip has an active surface and a non-active surface opposed to the active surface, allowing the non-active surface to be in contact with the substrate, and the active surface to abut against the thermally conductive member, and a plurality of bond pads are formed on the active surface of the chip at area free of being in contact with the thermally conductive member and connected with the first bonding wires.

9. The thermally enhanced semiconductor package of claim 2, wherein a plurality of bond fingers and a ground ring surrounding the bond fingers are formed on the upper surface of the substrate at area free of being in contact with the chip, allowing the bond fingers to be connected with the first bonding wires, and the ground ring to be connected with the second bonding wires.

10. The thermally enhanced semiconductor package of claim 9, wherein the substrate is formed with a plurality of conductive vias and ground vias penetrating therethrough, the conductive vias having one end thereof connected to the bond fingers and the other end connected to the corresponding solder balls, and the ground vias having one end thereof connected to the ground ring and the other end connected to the corresponding solder balls.

11. A thermally enhanced semiconductor package with EMI shielding, comprising:

a substrate having an upper surface and a lower surface opposed to the upper surface;

at least one chip mounted on the upper surface of the substrate and electrically connected to the substrate by a plurality of solder bumps;

a thermally conductive member having a first surface and a second surface opposed to the first surface, allowing the second surface to be attached to the chip and electrically coupled to the substrate by a plurality of bonding wires; and an encapsulant formed on the upper surface of the substrate for encapsulating the chip, solder bumps, thermally conductive member, and bonding wires.

12. The thermally enhanced semiconductor package of claim 11, further comprising: a plurality of solder balls implanted on the lower surface of the substrate.

13. The thermally enhanced semiconductor package of claim 11, wherein the thermally conductive member has a coefficient of thermal expansion similar to that of the chip.

14. The thermally enhanced semiconductor package of claim 13, wherein the thermally conductive member is made of copper.

15. The thermally enhanced semiconductor package of claim 11, wherein a metal layer is applied over predetermined portions on the first surface of the thermally conductive member and connected with the bonding wires.

16. The thermally enhanced semiconductor package of claim 15, wherein the metal layer entirely or partly covers the first surface of the thermally conductive member.

17. The thermally enhanced semiconductor package of claim 15, wherein the metal layer is made of nickel/gold (Ni/Au) alloy or silver (Ag).

18. The thermally enhanced semiconductor package of claim 15, wherein area on the first surface of the thermally conductive member free of forming the metal layer and bonding wires is exposed to outside of the encapsulant.

19. The thermally enhanced semiconductor package of claim 11, wherein the chip has an active surface and a non-active surface opposed to the active surface, allowing the non-active surface to be in contact with the thermally conductive member, and a plurality of bond pads are formed on the active surface of the chip and connected with the solder bumps.

20. The thermally enhanced semiconductor package of claim 12, wherein a plurality of bond pas are formed on the upper surface of the substrate at area mounted with the chip, and a ground ring is formed on the upper surface of the substrate outside the area for mounting the chip and is connected with the bonding wires.

21. The thermally enhanced semiconductor package of claim 20, wherein the substrate is formed with a plurality of conductive vias and ground vias penetrating therethrough, the conductive vias having one end thereof connected to the bond pads formed on the substrate and the other end connected to the corresponding solder balls, and the ground vias having one end thereof connected to the ground ring and the other end connected to the corresponding solder balls.

* * * * *